United States Patent
Unno et al.

(10) Patent No.: US 7,069,631 B2
(45) Date of Patent: Jul. 4, 2006

(54) METHOD FOR MANUFACTURING A LIQUID EJECTING HEAD

(75) Inventors: Akira Unno, Kanagawa-ken (JP);
Takao Yonehara, Kanagawa-ken (JP);
Tetsuro Fukui, Kanagawa-ken (JP);
Takanori Matsuda, Kanagawa-ken (JP); Kiyotaka Wasa, Nara-ken (JP)

(73) Assignees: Canon Kabushiki Kaisha, Tokyo (JP);
Wasa, Kiyotaka, Nara (JP)

( * ) Notice: Subject to any disclaimer, the term of this patent is extended or adjusted under 35 U.S.C. 154(b) by 0 days.

(21) Appl. No.: 11/240,524

(22) Filed: Oct. 3, 2005

(65) Prior Publication Data

US 2006/0028100 A1    Feb. 9, 2006

Related U.S. Application Data

(62) Division of application No. 10/071,095, filed on Feb. 11, 2002.

(30) Foreign Application Priority Data

Feb. 9, 2001    (JP) ............................. 2001-033823

(51) Int. Cl.
*H01L 17/00* (2006.01)
*H01L 21/00* (2006.01)

(52) U.S. Cl. .................... 29/25.35; 29/890.1; 29/831; 29/832; 438/21

(58) Field of Classification Search ............... 29/25.35, 29/890.1, 831, 832; 347/68–70; 310/328, 310/358, 330–337, 324; 438/21; 417/413.2
See application file for complete search history.

(56) References Cited

U.S. PATENT DOCUMENTS

| 4,631,436 | A | | 12/1986 | Edinger et al. |
| 4,783,821 | A | | 11/1988 | Muller et al. |
| 5,160,870 | A | | 11/1992 | Carson et al. |
| 5,513,431 | A | * | 5/1996 | Ohno et al. ................. 29/890.1 |
| 5,530,465 | A | * | 6/1996 | Hasegawa et al. ............ 347/70 |
| 5,719,607 | A | | 2/1998 | Hasegawa et al. |
| 5,802,686 | A | * | 9/1998 | Shimada et al. ........... 29/25.35 |
| 5,804,907 | A | | 9/1998 | Park et al. |
| 5,984,458 | A | | 11/1999 | Murai |
| 6,142,615 | A | * | 11/2000 | Qiu et al. ..................... 347/70 |
| 6,331,259 | B1 | * | 12/2001 | Ozaki et al. .................. 216/27 |
| 6,347,862 | B1 | | 2/2002 | Kanno et al. |
| 6,639,340 | B1 | | 10/2003 | Qiu et al. |
| 2002/0076875 | A1 | | 6/2002 | Wasa et al. |
| 2003/0003695 | A1 | | 1/2003 | Unno et al. |

FOREIGN PATENT DOCUMENTS

EP    0 799 700 A    10/1997

(Continued)

*Primary Examiner*—A. Dexter Tugbang
*Assistant Examiner*—Tai Van Nguyen
(74) *Attorney, Agent, or Firm*—Fitzpatrick, Cella, Harper & Scinto (57) ABSTRACT

A piezoelectric structure includes a vibrational plate and a piezoelectric film. The vibrational plate includes a layer of a monocrystal material, a polycrystal material, a monocrystal material doped with an element which is different from an element constituting the monocrystal material, or a polycrystal material doped with an element which is different from an element constituting the polycrystal materials. Oxide layers sandwich the aforementioned layer. The piezoelectric film has a single orientation crystal or monocrystal structure.

7 Claims, 3 Drawing Sheets

FOREIGN PATENT DOCUMENTS

| | | |
|---|---|---|
| EP | 0 993 953 A | 4/2000 |
| EP | 1 038 675 A | 9/2000 |
| GB | 2 339 724 A | 2/2000 |
| JP | 8-112896 | 5/1996 |
| JP | 10-44406 | 2/1998 |
| JP | 10-286953 | 10/1998 |
| JP | 11-348285 | 12/1999 |
| JP | 2000-37877 | 2/2000 |
| KR | 2000-0016488 | 3/2000 |
| WO | WO 98/46429 | 10/1998 |

* cited by examiner

METHOD FOR MANUFACTURING A LIQUID EJECTING HEAD

This is a divisional application of application Ser. No. 10/071,095, filed on Feb. 11, 2002, now allowed.

FIELD OF THE INVENTION AND RELATED ART

The present invention relates to a piezoelectric structure, a liquid ejecting head and a manufacturing method therefor.

Recently, printers using liquid ejection recording devices are widely used as printing apparatuses for personal computers or like, because of the high printing property, easy manipulation, low cost or the like. The liquid ejection recording devices are of a type in which a bubble is generated in liquid such as ink by thermal energy, and the droplet is ejected by the resulting pressure wave, a type in which the droplet is sucked and discharged by electrostatic force, a type in which a pressure wave is produced by a vibration element such as a piezoelectric element, or the like.

In a liquid ejecting apparatus using a piezoelectric element, there are provided a pressure chamber in fluid communication with a liquid supply chamber, a liquid ejection outlet in fluid communication with the pressure chamber, a vibrational plate of a piezoelectric element connected to the pressure chamber. With such a structure, a predetermined voltage is applied to the piezoelectric element to collapse and expand the piezoelectric element, thus producing a vibration. This compresses the liquid in the pressure chamber and ejects the droplet through the liquid ejection outlet. Recently, a liquid ejecting apparatus is widely used, and the improvement in the printing property, particularly, the high resolution, the high speed printing, and/or long size liquid ejecting head are desired. To meet such demands, high resolution and high speed liquid ejecting head is tried, using a multi-nozzle head structure having high density nozzles. In order to increases the density, it is required to downsizing the piezoelectric element for ejecting the liquid. It is desirable that manufacturing is completed through a semiconductor film formation process, from the some point of low cost with high precision, particularly in the case of the long liquid ejecting head.

However, the piezoelectric film is manufactured by forming PbO, $ZrO_2$ and $TiO_2$ powder into a sheet, and then baking it, and therefore, it is difficult to produce a thin piezoelectric film such as not more than 10 μm. Because of this, fine processing of the piezoelectric film is difficult, and this makes the downsizing of the piezoelectric element difficult. In the case that piezoelectric film is produced by baking the powder, the influence of the grain boundary of crystalline is not negligible, and therefore, good piezoelectric particularly property cannot be provided. As a result, the piezoelectric film produced by baking the powder does not exhibit satisfactory piezoelectric particularly property for ejecting the liquid such as ink in the thickness is not more than 10 μm. For this reason, a small size liquid ejecting head having necessary properties for liquid ejection has not been accomplished.

The powder sheet is simultaneously baked on a vibrational plate and/or a structural member of ceramic or the like. With this, when a high density ceramic is intended, a dimension change due to contraction of the materials is not negligible. This places a limit to a size, and it is difficult to arrange a great number of liquid ejection outlets (nozzles).

Japanese Laid-open Patent Application Hei 11-348285 proposes a structure and a manufacturing method for a liquid ejecting head using a micro fabrication through a semiconductor process employing a sputtering method. In this publication, an orientatioal film formation of platinum is effected on a monocrystal MgO, and a layer of perovskite not comprising Zr layer and PZT layer are laminated.

However, with the system, there arise the following problems:

(1) the single orientation crystal or monocrystal PZT are not stably produced with high reproducibility:

(2) the oriented PZT layer can be provided only on a monocrystal substrate of monocrystal MgO or the like which is expensive, and therefore, the process is very expensive. In addition, there is a limited in the size of the monocrystal substrate of MgO, and therefore it is not possible to produce a large area substrate.

(3) Using the method disclosed in this publication, the connection occurs in the neighborhood of the piezoelectric member or the connecting portion between the piezoelectric member and the member constituting the pressure chamber (liquid chamber) by adhesive material or the likes. In the region of micromachining, the reliability against the repetition of the stresses or the like is not sufficient.

(4) The vibrational plate in the method disclosed in the application, is directly contacted to the liquid such as ink in the liquid ejecting head, and in addition, in the manufacturing process, it is contacted to the acid, alkali or another chemical agent, and therefore, it is not possible to produce reliable liquid ejection elements. Moreover, the manufacturing process is complicated, and the liquid ejecting heads are expensive.

SUMMARY OF THE INVENTION

Accordingly, it is a principal object of the present invention to provide a liquid ejecting head and a manufacturing method therefor, wherein a piezoelectric film, vibrational plate or the like constituting the piezoelectric element are made thin films, by which micro fabrication ordinarily used in the semiconductor process is usable, and a piezoelectric structure having a high durability and high piezoelectric particularly property with long size and high density of liquid ejection outlets.

According to an aspect of the present invention, there is provided a piezoelectric structure comprising: a vibrational plate; a piezoelectric film; said vibrational plate including a layer of a monocrystal material, a polycrystal material, a monocrystal material doped with an element which is different from an element constituting the monocrystal material, or a polycrystal material doped with an element which is different from an element constituting the polycrystal materials, and oxide layers sandwiching the aforementioned layer; said piezoelectric film has a single orientation crystal or monocrystal structure.

According to another aspect of the present invention, there is provided a manufacturing method for manufacturing a piezoelectric structure having a vibrational plate and a piezoelectric film, said method comprising: a step of forming a second oxide layer on a silicon substrate having a monocrystal silicon layer on a silicon layer with an oxide layer interposed therebetween; a step of forming a piezoelectric film of a single orientation crystal or monocrystal structure on the second oxide layer; and a step of an upper electrode on the piezoelectric film.

According to a further aspect of the present invention, there is provided a liquid ejecting head comprising a liquid ejection outlet; a main assembly substrate portion having a pressure chamber in fluid communication with said liquid ejection outlet and having an opening; a piezoelectric structure connected so as to plug the opening; said piezoelectric structure including, a vibrational plate; a piezoelectric film; said vibrational plate including a layer of a monocrystal material, a polycrystal material, a monocrystal material doped with an element which is different from an element constituting the monocrystal material, or a polycrystal material doped with an element which is different from an element constituting the polycrystal materials, and oxide layers sandwiching the aforementioned layer, said piezoelectric film has a single orientation crystal or monocrystal structure.

According to a further aspect of the present invention, there is provided a manufacturing method for a liquid ejecting head including a liquid ejection outlet; a main assembly substrate portion having a pressure chamber in fluid communication with said liquid ejection outlet and having an opening; a piezoelectric structure connected so as to plug the opening, said manufacturing method comprising: a step of forming a second oxide layer on a silicon substrate having a monocrystal silicon layer on a silicon layer with an oxide layer interposed therebetween; a step of forming a piezoelectric film of a single orientation crystal or monocrystal structure on the second oxide layer.

According to the present invention, the vibrational plate constituting the piezoelectric structure and having a monocrystal or polycrystal structure is sandwiched by oxide materials, so that even if fine cracks are produced as a result of repetition of mechanical displacement, the strength of the vibrational plate per se is maintained, and the adhessiveness relative to the piezoelectric film is not deteriorated, and therefore, durable devices can be provided.

In addition, a piezoelectric film of single orientation crystal or monocrystal having a high piezoelectric constant can be formed on the silicon substrate, and therefore, a film having a uniform crystal orientation can be sequentially formed on the substrate, so that piezoelectric structure having high frequency property, durability and electrostrictive/piezoelectric property, can be produced.

By incorporating such a piezoelectric structure, a device having a high durability, high density, large ejection power with high frequency, in which the performance of each of the liquid ejection outlets are uniform can be provided. In addition, by producing the piezoelectric member and the vibrational plate or the like as thin films, the micro fabrication usable in the semiconductor process is available. In addition, a liquid ejecting head having a high curability, electrostrictive/piezoelectric particularly property, a large length, a stabilized reliability, can be provided.

DESCRIPTION OF THE PREFERRED EMBODIMENTS

The description will be made as to the preferred embodiment of the present invention in conjunction with the accompanying drawings.

Figure 1:
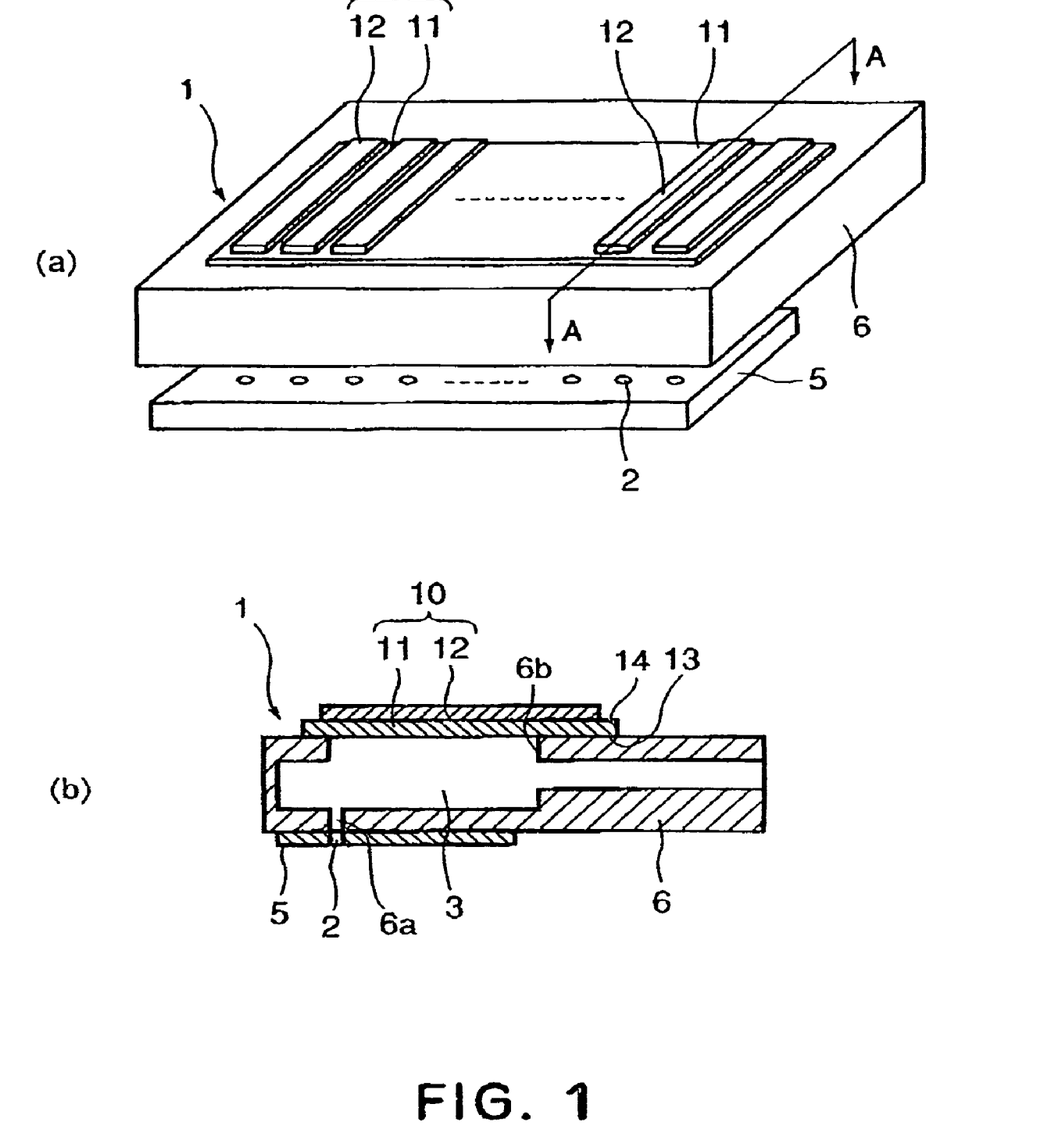
FIG. 1 is a perspective view of a liquid ejecting head according to an embodiment of the present invention (a), and a sectional view thereof taken on a line A—A.
Figure 2:
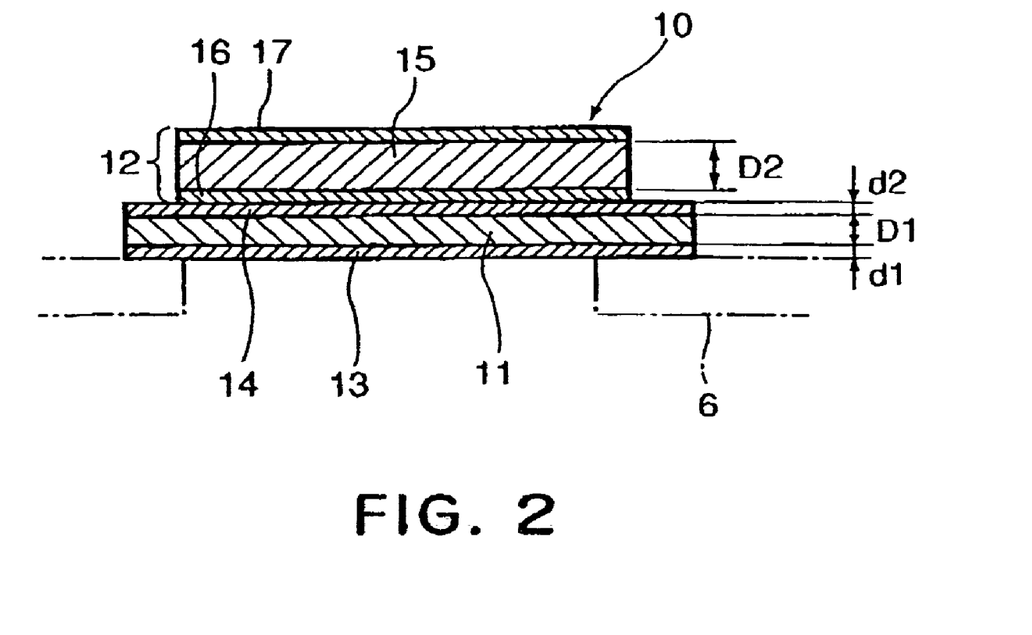
FIG. 2 is a partially sectional view of a piezoelectric structure usable for a liquid ejecting head according to the embodiment of the present invention.

In FIG. 1, (a) is a perspective view of a liquid ejecting head according to an embodiment of the present invention, and (b) is a sectional view taken along a line A—A in (a). FIG. 2 is a partially sectional view of a piezoelectric structure usable for a liquid ejecting head according to the embodiment of the present invention.

As shown in FIG. 1, the liquid ejection recording head 1 in this embodiment comprises a plurality of liquid ejection outlets (nozzles) 2, a plurality of pressure chambers (liquid chambers) 3, a piezoelectric structure 10 provided for each of the pressure chambers 3. The liquid ejection outlets 2 are formed in the orifice plate 5 at predetermined intervals. The pressure chamber 3 is formed in the main assembly substrate portion (liquid chamber substrate) 6, corresponding to the liquid ejection outlet 2. The pressure chamber 3 as are connected to the respective liquid ejection outlets 2 through the liquid flow paths 6a. In this embodiment, the liquid ejection outlets 2 are provided on the bottom side, the they may be provided on the lateral side. On the top side of the main assembly substrate portion 6, an opening 6b is formed corresponding to each of the pressure chamber 3, and the piezoelectric structure 10 is positioned so as to plug the opening 6b on the top side of the main assembly substrate portion 6. The piezoelectric structure 10 comprises a vibrational plate 11 and a piezoelectric element 12.

The vibrational plate 11 constituting the piezoelectric structure 10 of this embodiment, as shown in FIG. 2, comprises monocrystal material or polycrystal material, which is sandwiched by a first oxide layer 13 and a second oxide layer 14. The piezoelectric film 15 of the piezoelectric element 12 constituting the piezoelectric structure 10 is made of single orientation crystal or monocrystal material. On the top and bottom sides thereof, there are formed electrodes 16, 17 of Au, Pt one like. The piezoelectric element 12 is constituted by the piezoelectric film 15 and the electrodes 16, 17.

By constituting the piezoelectric structure 10 in this manner, the vibrational plate 11 of the monocrystal polycrystal structure is sandwiched by the oxides 13, 14, and therefore, despite repeated mechanical displacements with the result of fine cracks, the vibrational plate per se is not damaged, and the adhessiveness relative to the piezoelectric film is not deteriorated. Thus, the durability is high.

As to the vibrational plate 11, and the first oxide layer 13 at the side remote from the piezoelectric film 15 and the second oxide layer 14 at the piezoelectric film 15 side, with the vibrational plate 11 interposed therebetween, the film thicknesses are selected so as to satisfy $d1+d2 \leq D1$, where D1 is a film thickness of the vibrational plate 11, d1 is a film thickness of the first oxide layer 13, and d2 is a film thickness of the second oxide layer 14. When this is satisfied, the durability is further improved in the piezoelectric structure (10) and the liquid ejecting head (1).

More specifically, the film thicknesses of the vibrational plate 11 (film thickness D1), the first oxide layer 13 (film thickness d1), second oxide layer 14 (film thickness d2) are $d1=5$ nm–5 μm, preferably 10 nm–3 μm. The film thickness d2 is 5 nm–3 µm, preferably 10 nm–1 µm. Film thickness D1 is 100 nm–10 µm, preferably 500 nm–5 µm. If the film thickness D1 of the vibrational plate 11 exceeds 10 µm, the degree of displacement becomes insufficient for a liquid ejecting head, and therefore, it is not preferable for the high density nozzle arrangement.

In this embodiment of the piezoelectric structure, d1+d2+D1≦5×D2 is preferably satisfied, where D2 is a film thickness of the piezoelectric film 15. When d1+d2+D1≦5×D2 is satisfied, the degree of displacement in the piezoelectric structure is large enough. The specific film thickness D2 of the piezoelectric film 15 is 500 nm–10 µm, preferably 1 µm–5 µm.

The material of the vibrational plate 11 is Si, preferably monocrystal Si. The vibrational plate 11 may be doped with element such as B. The grating constant of the Si used for vibrational plate 11 may be used to provide the piezoelectric film 15 of single orientation crystal or monocrystal.

The material of the first oxide layer 13 formed on upper may be $SiO_2$, YSZ, (yttrium-stabilized zirconia), MgO or the like, and the material of the second oxide layer 14 may be at least one of $SiO_2$, YSZ, $Al_2O_3$, $LaAlO_3$, $Ir_2O_3$, MgO, SRO($SrRuO_3$) STO($SrTiO_3$) or the like. When the use is made with an oxide other than $SiO_2$, the material has a crystal orientation (111) or (100). When the oxide layer is a combination of $SiO_2$ and another oxide, a small amount of metal element of said another oxide may be contained to provide a preferable vibration property or the like of the vibrational plate. The content is not more than 10 at %, preferably not more than 5 at %.

The material of the piezoelectric film 15 to be used for the piezoelectric structure 10 according to this embodiment may be, for example: PZT[$Pb(Zr_xTi_{1-x})O_3$], PMN[$Pb(Mg_xNb_{1-x})O_3$], PNN[$Pb(Nb_xNi_{1-x})O_3$], PSN[$Pb(Sc_xNb_{1-x})O_3$], PZN[$Pb(Zn_xNb_{1-x})O_3$], PMN-PT$\{(1-y)[Pb(Nb_{1-x})O_3]\text{-}y[PbTiO_3]\}$, PSN-PT$\{(1-y)[Pb\{Sc_xNb_{1-x}\}O_3]\text{-}y[PbTiO_3]\}$, PZN-PT $\{(1-y)[Pb(Zn_xNb_{1-x})O_3]\text{-}y[PbTiO_3]\}$. Here, x and y are not more than 1 and not less than 0. For example, in the case of PMN, x is preferably 0.2–0.5; and in the case of PSN, x is preferably 0.4–0.7; in the case of PMN-PT, y is preferably 0.2–0.4; in the case of PSN-PT, y is preferably 0.35–0.5; in the case of PZN-PT, y is preferably 0.03–0.35.

In this embodiment, these materials can be formed into a single orientation crystal or monocrystal film, and therefore, the performance is high. For example, as a method of providing a piezoelectric film having a monocrystal structure through a sputtering film formation method, a rapid cooling from the film formation temperature as a rate of not less than 30° C./min. Another method is usable.

The piezoelectric film may have a further structure of a single composition, or may be a laminated structure of two or more compositions. For the pulse of crystalline structure control, the film formation may be carried out after film formation of the anchoring layer of different material compositions. For example, in the case of monocrystal film formation of PZT, Zr component tends to enter at the initial stage, and therefore, the film formation thereof is preferably carried out after the film formation of the anchoring layer of $PbTiO_3$. It may be a composition doped with a small amount of element in the main component. The single orientation crystal or the monocrystal has a priority orientation degrees of the film of not less than 80%, preferably not less than 85%, and further preferably not less than 95%, as determined by XRD (X-ray diffraction apparatus) (Θ–2Θ (out of plane) measurement).

An example in which the monocrystal piezoelectric film of PMN-PT or PZN-PT is used as a piezoelectric element is disclosed in U.S. Pat. No. 5,804,907, in which a bulk of crystal member produced through TSSG method (Top Speeded Solution Growth method) is cut and then is connected to the substrate (vibrational plate). This method is not suitable for a micro fabrication, and it is not possible to provide a film thickness of the piezoelectric film not more than 10 µm. In addition, it is necessary to cut along the orientation of the crystal in the bulk, which is cumbersome and time-consuming, and there is a probability of erroneous alignment with the crystal orientation.

According to this embodiment, a film having a sequentially aligned crystal orientation can be formed on the substrate, and therefore, such programs do not arise. In the case of the liquid ejecting head, the variations of the ejection performance is small, and the connection strength is high. In addition, the film is a piezoelectric film of single orientation crystal or monocrystal, and therefore, the durability and the piezoelectric particularly property are preferable.

Specific layer structures of the piezoelectric structure according to this embodiment will be described. The display of the layer structure is "upper electrode 17//piezoelectric film 15//lower electrode 16//second oxide layer 14//vibrational plate 11//first oxide layer 13" (reference numerals are as shown in FIG. 2).

EXAMPLE 1

Pt//PZT(001)/PT(001)//Pt(100)//MgO(100)//Si(100)//$SiO_2$

The vibrational plate with this layer structure is Si(100), and the oxide layers sandwiching the vibrational plate is MgO(100) and $SiO_2$. The following is other examples:

EXAMPLE 2

Au//PZT(001)/PT(001)//PT(100)//YSZ(111)/$SiO_2$//Si(111)//$SiO_2$

EXAMPLE 3

Au//PZT(111)/PT(111)//PT(111)//YSZ(100)/$SiO_2$//Si(100)//$SiO_2$

EXAMPLE 4

Pt//PZT(111)/PT(111)//Pt(111)//YSZ(100)/Zr//Si(100)//$SiO_2$

EXAMPLE 5

Pt//PZT(111)/PT(111)//Pt(111)//MgO(111)//Si(100)//$SiO_2$

EXAMPLE 6

Au//PZT(001)//SRO(001)//Si(100)//$SiO_2$

EXAMPLE 7

Al//PZT(111)//SRO(111)//Si(111)//$SiO_2$

EXAMPLE 8

Au//PZT(111)/PT(111)//Pt(111)//YSZ(100)/$SiO_2$//Si(100)//YSZ(100)

EXAMPLE 9

Pt//PZT(001)//SRO(001)//Si(100)//YSZ(100)

EXAMPLE 10

Au//PZT(001)/PT(001)//Pt(100)//MgO(100)//Si(100)//YSZ(100)

EXAMPLE 11

Pt//PZT(001)/PT(001)//Pt(100)//MgO(100)//Si(100)//YSZ(100)

EXAMPLE 12

Pt//PZT(001)/PT(001)//Pt(100)//Al$_2$O$_3$(100)//Si(100)//SiO$_2$

EXAMPLE 13

Ag//PZT(001)/PT(001)//Pt(100)//LaAlO$_3$(100)//Si(100)//SiO$_2$

In examples 6, 7 and 9, SRO has a director conductivity, and it also functions as the second oxide layer 14 and the lower electrode 16. In the foregoing examples, the piezoelectric film is of a laminated structure of PZT for PZT/PT. The structure may be replaced with the layer structure of PMN, PZN, PSN, PNN, PMN-PT, PSN-PT, PZN-PT.

For example, the followings are usable alternatives:
Au//PMN(001)//Pt(100)//MgO(100)//Si(100)//SiO$_2$;
Pt//PMN-PT(001)//Pt(100)//MgO(100)/SiO$_2$//Si(100)//SiO$_2$;
Al//PMN-PT(001)/PT(001)//Pt(100)//YSZ(111)/SiO$_2$//Si(111)//SiO$_2$ The crystal orientations indicated in the parentheses in the layer structure indicate the crystal orientation having priority orientation not less than 80%, preferably not less than 85%, other preferably not less than 95%, as described hereinbefore.

As for the second oxide layer 14, the SiO$_2$ which is a Si oxide film or another oxide (YSZ, MgO, Ir$_2$O$_3$) may be selected depending on the manufacturing process. For example, it is possible to suppress production of SiO$_2$ by forming a YSZ film using the metal target during the film formation of the YSZ. By thin film film formation of metal such as Zr or the like on the Si layer, the production of SiO$_2$ can be prevented.

The description will be made as to the manufacturing method of the piezoelectric structure and the liquid ejecting head according to the embodiment of the present invention.

The manufacturing method for the piezoelectric structure having the vibrational plate and the piezoelectric film according to this embodiment comprises a step (1) of forming a second oxide layer on a silicon substrate having a monocrystal silicon layer on a silicon layer with an oxide layer interposed therebetween; a step (2) of forming a piezoelectric film of a single orientation crystal or monocrystal structure on the second oxide layer; and a step (3) of an upper electrode on the piezoelectric film.

Another manufacturing method for a liquid ejecting head including a liquid ejection outlet; a main body substrate portion having a pressure chamber in fluid communication with said liquid ejection outlet and having an opening; a piezoelectric structure connected so as to plug the opening, according to the present invention comprises, in addition to the steps (1)–(3), a step (4) of separating the piezoelectric film into a plurality of portions; a step (5) of an upper electrode on the piezoelectric film; a step (6) of forming said pressure chamber.

Each of these steps will be described. In the step (1) the silicon substrate having the monocrystal silicon layer above the silicon layer with the oxide layer therebetween may be SOI (silicon-on-insulator) substrate, or a film of monocrystal oxide may be formed on the silicon substrate, and a film of monocrystal silicon layer may be formed thereon. In the case of SOI substrate, the oxide layer on the silicon layer is SiO$_2$, for example, and the monocrystal oxide is YSZ(100), YSZ(111), MgO(100), MgO(111), STO(100), STO(111) or the like, for example. The film thickness (d1) of the oxide layer is 5 nm–5 µm, preferably 10 nm–3 µm. These oxide layers are usable as an etching stop layer in the step (5) of forming a pressure chamber.

The second oxide layer formed on the monocrystal silicon is preferably formed prior to the step (2) and/or step (3). The second oxide layer may be SiO$_2$, YSZ(100), YSZ(111), SRO(001), SRO(111), MgO(100), MgO(111), Ir$_2$O$_3$(100), Ir2O$_3$(111), Al$_2$O$_3$(100), Al$_2$O$_3$(111), LaAlO$_3$(100), LaAlO$_3$(111), STO(100), STO(111) or the like, for example. The film thicknesses (d2) of them, are 5 nm–3 µm, preferably 10 nm–1 µm.

In the above-described layer structure, the second oxide layer is MgO in example 1, and YSZ and SiO$_2$ in example 2. The SiO$_2$ may be produced by oxidative reaction during YSZ film formation which is a buffering film, or maybe produced by heat treatment after the film formation. When the second oxide layer contains SiO$_2$, it is preferable that small amount of the medal of another oxide layer (buffering film) is contained in the SiO$_2$, and the method therefor is preferably a sputtering method using an oxide target as the film formation method for another oxide layer. The film thickness of SiO$_2$ layer can be controlled by selecting the temperature lowering process from maximum temperature of the formed YSZ film, a temperature maintaining duration thereof, a re-heat-treatment condition and a temperature maintaining duration thereof. For example, the film thickness of the SiO$_2$ layer can be increased by the sputtering film formation temperature being maintained in the water vapor atmosphere. The production of the SiO$_2$ layer at the interface between the YSZ and the Si may be prevented by first forming a metal layer using the metal Zr target and then forming a film of YSZ. It can be selected depending on the material and the performance whether the SiO$_2$ layer is to be formed or not.

In the step (2), a piezoelectric film having a single layer structure or a laminated structure is formed, using any of composition such as PZT, PMN, PZN, PSN, PNN, PMN-PT, PSN-PT, PZN-PT or the like. The piezoelectric film preferably has a single orientation crystal or monocrystal structure.

The formation of the upper electrode on the piezoelectric film in the step (3), may be effected through a sputtering method, an evaporation method, an application method or the like. The electrode material may be a metal material such as Au, Pt, Cr, Al, Cu, Ir, Ni, or an electroconductive oxide such as SRO, ITO. The upper electrode may be a solid electrode or a comb-shaped electrode on the piezoelectric film.

In the manufacturing method for the piezoelectric structure, according to the embodiment of the present invention, it is possible that single orientation crystal or monocrystal piezoelectric film having a high piezoelectric constant can be formed on the silicon substrate, and therefore, a vibrational plate in which the connection strength, the durability is high, can be produced. Thus, a piezoelectric structure having a high frequency property, durability and electrostrictive/piezoelectric property can be provided.

In the manufacturing method for the liquid ejecting head, the step of separating the piezoelectric film in step (4) is a patterning step in which the piezoelectric film produced by the step (2). The patterning is separated corresponding to the liquid ejection outlets (nozzles) and the pressure chambers. The patterning method may be a wet etching type, a dry etching type, a mechanical cutting type or like. In the case of the wet etching and dry etching types, a protecting film formation may be carried out for the protection of the silicon substrate with the resist treatment for the patterning. In addition, a resin material or the like having a low rigidity not preventing expansion and contraction of the piezoelectric film may be filled between the separated piezoelectric film.

The step (5) for forming the pressure chamber includes a process step for the silicon layer at the opposite side and/or a step of connecting a separate substrate having a formed pressure chamber portion with the silicon substrate. The process step for the silicon layer may be carried out through wet etching, dry etching, mechanical process (sandblast process or like). The substrate for said separate substrate having the pressure chamber portion may be a silicon substrate, a SUS substrate, a polymer material substrate or the like. The connecting method in the case of use of the silicon substrate, the SUS substrate or the like may be an anodic oxidation connection method, active metal soldering method or a method using an adhesive material. When a polymer material is used, etching process with the use of resist material is usable. Alternatively, a substrate preprocessed is usable. The configuration of the pressure chamber may be rectangular, circular, elliptical or the like. In addition, in the case of side shooter, the cross-sectional configuration of the pressure chamber may be reduced toward the nozzle.

The step (6) of forming the liquid ejection outlet may include connecting an orifice plate in which the liquid ejection outlets are formed corresponding to respective pressure chamber portions, or forming the liquid ejection outlets from resist material or the like. Alternatively, after the polymer substrate is laminated, the liquid ejection outlets may be formed corresponding to the pressure chambers by laser machining. In the case of the formation of the liquid ejection outlets using a resist material, the forming operation may be carried out simultaneously with the step (5). The order of the steps (4), (5) and (6) is not limiting, and the separating step of the piezoelectric film (4) may be carried out finally.

According to the manufacturing method for the liquid ejecting head in this embodiment of the present invention, similarly to the case of the above-described piezoelectric structure, the piezoelectric film has a single orientation crystal or monocrystal structure, and therefore, the resultant vibrational plate has a high connection strength and durability, and therefore, it is possible to provide a liquid ejecting head having a high density, a large ejection power and a suitability to a high frequency printing.

The description will be made as to specific examples.

EXAMPLE 1

Figure 3:
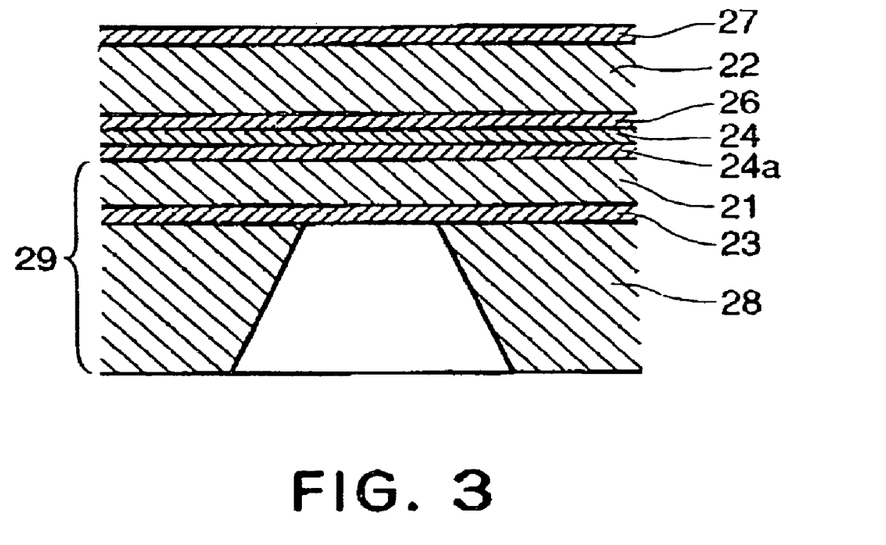
FIG. 3 is a partially sectional view of a piezoelectric structure manufactured on the basis of a manufacturing method according to an embodiment of the present invention.

Referring to FIG. 3, an example will be described. FIG. 3 is a partially sectional view of a piezoelectric structure manufactured through a method for manufacturing the piezoelectric structure according to an embodiment of the present invention. A YSZ (100) 24 film having a thickness of 0.3 μm was formed on a monocrystal Si layer under 800° C. through the sputtering film formation, using a SOI substrate constituted by a silicon layer 28 having a thickness of 625 μm, a SiO$_2$ layer 23 having a thickness of 0.2 μm and a monocrystal Si(100) layer 21 having a thickness of 3 μm. Thereafter, a lower electrode Pt(111) 26 was formed into a thickness of 0.5 μm, and a piezoelectric film 22 of PT(111), PZT(111) was formed under 600° C. The composition of PZT was Pb(Zr$_{0.53}$Ti$_{0.47}$)O$_3$. The total film thickness of the piezoelectric film 22 was 3.5 μm. In all of the film formation steps, the temperature rising speed in the cooling process after the film formation was not less than 40° C./min. To control the single crystal property of the film. By the step, 0.02 μm thick SiO$_2$ layer 24a was formed as the second oxide layer at the interface between the YSZ(100) 24 and Si(100) 21. The film thickness of the SiO$_2$ layer 24a was 0.2 μm in the case that it was formed under 800° C., and then it was maintained as it is in the water vapor for 100 min. The contents of Y and Zr metal in the SiO$_2$ was 4.6 at %. The single crystal property of the piezoelectric film 22 had not less than 99% orientation of (111) as a result of confirmation by XRD (X line diffraction apparatus).

On the piezoelectric film 22, upper electrode 27 of Au was evaporated. Thereafter, a silicon layer 28 was etched into a rectangular configuration having a width 100 μm and a length 2 mm at the first oxide layer 23 by wet etching using TMAH (trimethylammonium hydroxide).

From the piezoelectric structure (FIG. 3) manufactured in the above-described steps, the upper and lower electrodes 26, 27 are taken out, and the displacement was measured at driving frequency of 35 kHz and driving voltage of +5V/−5V and was 0.26 μm at the central portion. In the case of the structure having a 1.0 μm thick second oxide layer 24, the preferable displacement of 0.25 μm was measured.

A piezoelectric structure having the same structures except that piezoelectric film was a polycrystal member having an orientation property of 43% was manufactured, and the displacement was 0.04 μm. The variations were significant, and the durabilty was low.

EXAMPLE 2

Using a substrate in which the monocrystal Si layer has a crystal orientation (111), the sputtering film formation was carried out to manufacture the structure of example 2 in the above-described layer structure. By using a crystal orientation (001) of PZT, the durability was further improved. The displacement measured after the etching process similarly to Embodiment 1, was 0.25 μm–0.28 μm which were preferable.

EXAMPLE 3

Figure 4:
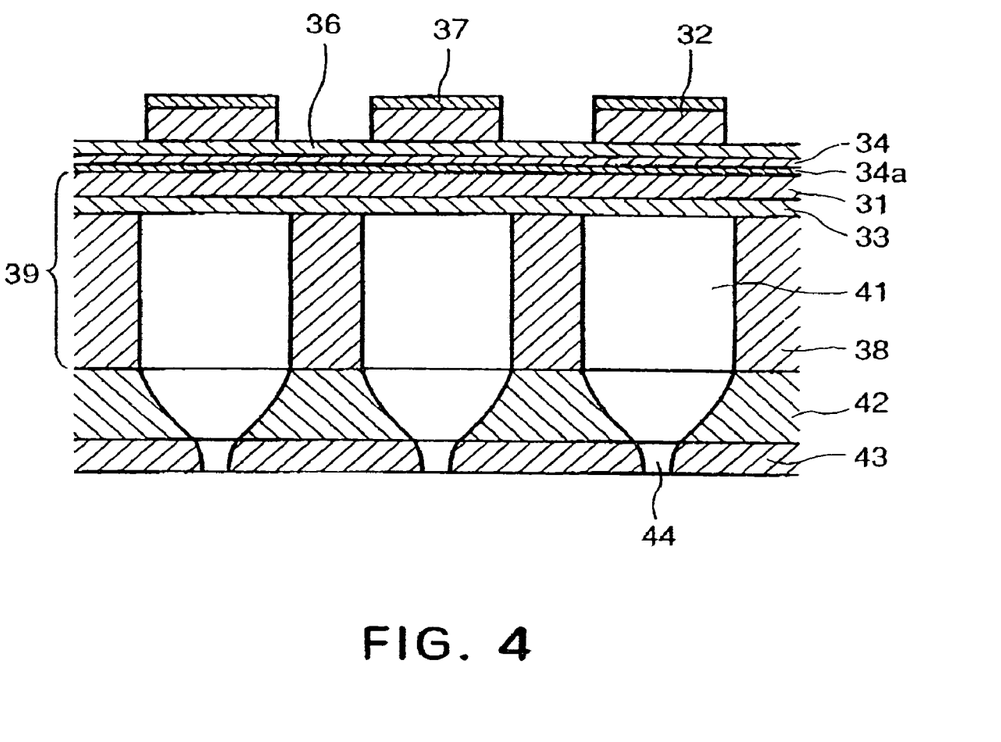
FIG. 4 is a partially sectional view of a liquid ejecting head manufactured on the basis of a manufacturing method according to an embodiment of the present invention.

Referring to FIG. 4, the description will be made as to the manufacturing method for the liquid ejecting head according to this example. FIG. 4 is a partially sectional view of a liquid ejecting head manufactured through the manufacturing method according to the embodiment of the present invention.

A MgO(100) 34 layer was formed into a thickness of 0.3 μm on a monocrystal Si(100) 31 having been B-doped, using a substrate 39 of a B-doped monocrystal Si(100)/SiO$_2$/Si structure (film thicknesses were 2.5 μm/1 μm/250 μm). Furthermore, 0.4 μm thick of Pt(100) and a piezoelectric film 32 of PMN(001) were formed into a thickness of 2.3

μm. The composition of the PMN was adjusted by $Pb(Mg_{1/3}Nb_{2/3})O_3$. TEM observation has confirmed that $SiO_2$ layer 34a of 0.05 μm thick is formed at the interface between the $MgO_3$4 and the Si(100) 31. On the upper electrode 37, Au was pasted. The Si layer 38 was subjected to a plasma etching process using C4 F8 to form the pressure chamber 41. Thereafter, the Si middle substrate 42 and the orifice plate 43 constituting the pressure chamber were connected to provide the liquid ejecting head of this embodiment.

FIG. 4 shows the liquid ejecting head manufactured through the method of this example, in which designated by 31 is a vibrational plate of B-doped monocrystal Si; 32 is a piezoelectric film of PMN; 33 is a first oxide layer; 34, 34a are second oxide layer; 36 lower electrode; and 37 is upper electrode. Designated by 38 is a Si layer in which the pressure chamber 41 is formed; 42 is a middle substrate; 43 is an orifice plate in which the liquid ejection outlets 44 are formed. The pressure chamber 41 has a width of 60 μm, a depth of 2.2 mm, and a partition width between the adjacent pressure chambers 41 of 24 μm.

Using the liquid ejecting head, the ink ejection tests were carried out. A maximum ejection speed of /sec was confirmed at a driving frequency of 35 kHz with a driving voltage of +7V/−7V. The size of the droplets is controllably 3 pl–26 pl. Durability test repeating $10^9$ displacements was carried out, and the decrease of the displacement was not more than 5%.

Two liquid ejecting heads were manufactured with the same structure except for the film thickness of the monocrystal silicon layer being 10 μm and 11 μm. The displacement in the liquid ejecting head having the Si layer of 10 μm thick was smaller by 10% than the liquid ejecting head having the Si layer of 2.5 μm thick, but could eject high viscosity (10 cps) droplets. In the case of the liquid ejecting head using 11 μm, the reduction of the displacement was 17%, but it could eject the high viscosity droplets, similarly. However, the durability is slightly lower than the liquid ejecting head using 10 μm.

EXAMPLE 4

The piezoelectric film in Embodiment 3 was modified by using a piezoelectric film of PSN-PT(001) (the other structures were the same). The composition of PSN-PT was suggested to be $0.55[Pb(Sc_{1/2}Nb_{1/2})O_3]-0.45[PbTiO_3]$. The dimensions such as the width of the pressure chamber or the like were the same as in Embodiment 3. It was confirmed that ink could be ejected at a speed of 14.3 m/sec with the same driving conditions. In addition, when the width of the pressure chamber was changed to 40 μm, and the length of the pressure chamber was changed to 2.5 mm, and the ink could be ejected at a speed of not less than 10 m/sec which is practical.

EXAMPLE 5

The piezoelectric film in Embodiment 4 was changed to PZN-PT(001), without changing the other structures, and the liquid ejecting head was manufactured. The composition of PZN-PT was $0.90\{Pb(Zn_{1/3}Nb_{2/3})O_3\}-0.10\{PbTiO_3\}$. The ejection speed of the ink with the width of the pressure chamber being 60 μm was 14.1 m/sec which was preferable. The quantities of the droplets were very stable.

While the invention has been described with reference to the structures disclosed herein, it is not confined to the details set forth and this application is intended to cover such modifications or changes as may come within the purpose of the improvements or the scope of the following claims.

What is claimed is:

1. A method for manufacturing a liquid ejecting head that includes a main assembly substrate portion having a pressure chamber in fluid communication with a liquid ejection outlet and includes a piezoelectric structure provided corresponding to the pressure chamber, wherein the piezoelectric structure includes a vibrational plate and a piezoelectric element that includes (i) a piezoelectric film and (ii) a lower electrode and an upper electrode sandwiching the piezoelectric film, said method comprising:

a step of providing a silicon substrate having a monocrystal silicon layer on a silicon layer, with a first oxide layer between the monocrystal silicon layer and the silicon layer;

a step of forming a second oxide layer on the silicon substrate to form the vibrational plate, the vibrational plate comprising the monocrystal silicon layer, the first oxide layer and the second oxide layer, the first oxide layer and the second oxide layer sandwiching the monocrystal silicon layer;

a step of forming the lower electrode on the second oxide layer;

a step of forming a piezoelectric film of a single orientation crystal or a monocrystal on the lower electrode;

a step of separating the piezoelectric film into a plurality of portions;

a step of forming the upper electrode on the piezoelectric film; and a step of forming the pressure chamber by partly removing the silicon layer, which supports the vibrational plate.

2. A method for manufacturing a liquid ejecting head according to claim 1, wherein a film thickness D1 of the vibrational plate film thicknesses d1, d2 of the oxide layers satisfy $d1+d2 \leqq D1$.

3. A method for manufacturing a liquid ejecting head according to claim 2, wherein a film thickness D2 of the piezoelectric film satisfies $d1+d2+D1 \leqq 5 \times D2$.

4. A method for manufacturing a liquid ejecting head according to claim 1, wherein the piezoelectric film comprises one of PZT, PMN, PNN, PSN, PMN-PT, PNN-PT, PSN-PT and PZN-PT, and the piezoelectric film has a single layer structure or a laminated structure of different compositions.

5. A method for manufacturing a liquid ejecting head according to claim 1, wherein at least one of the oxide layers comprises at least one of $SiO_2$, YSZ, $Al_2O_3$, $LaAlO_3$, $Ir_2O_3$, MgO, SRO and STO.

6. A method for manufacturing a liquid ejecting head according to claim 1, wherein the main assembly substrate portion is made of Si and is in contact with one of the oxide layers.

7. A method for manufacturing a liquid ejecting head according to claim 6, wherein the piezoelectric film is disposed at a side of the other of the oxide layers.

* * * * *

UNITED STATES PATENT AND TRADEMARK OFFICE
CERTIFICATE OF CORRECTION

PATENT NO. : 7,069,631 B2
APPLICATION NO. : 11/240524
DATED : July 4, 2006
INVENTOR(S) : Akira Unno et al.

It is certified that error appears in the above-identified patent and that said Letters Patent is hereby corrected as shown below:

COLUMN 1:
Line 14, "like," should read --the like,--, "high" should read --high quality--, and "property," should read --properties,--.
Line 19, "sucked" should read --suctioned--.
Line 26, "a" should read --and a--.
Line 33, "the" should be deleted.
Line 34, "the" (2nd occurrence) should be deleted.
Line 35, "the" should be deleted.
Line 38, "high density" should read --a high density of--.
Line 39, "increases" should read --increase--, and "downsizing" should read --downsize--.
Line 40, "element" should read --element used--.
Line 41, "through" should read --by--.
Line 42, "some point" should read --point of view--.
Line 48, "10μm." should read --10μm thick.--.
Line 53, "crystalline" should read --the crystalline structure--, and "good" should read --a good--.
Line 54, "particularly" should be deleted.
Line 56, "particularly" should be deleted.
Line 57, "the" should read --a--.
Line 60, "accomplished." should read --achieved.--
Line 65, "dimension" should read --dimensional--.
Line 66, "to a" should read --on the--.

COLUMN 2:
Line 3, "a" (1st occurrence) should be deleted, and "through" should read --by--.
Line 5, "orientatioal" should read --orientational--.
Line 6, "MgO," should read --MgO layer,--.
Line 7, "Zr" should read --a Zr--.
Line 10, "are" should read --is--.
Line 15, "limited in" should read --limit to--.
Line 17, "large area substrate." should read --substrate having large area.--.
Line 18, "the" (2nd occurrence) should read --a--.
Line 19, "connection" should read --connection, by adhesive material or the like,--.
Line 22, "chamber) by adhesive material or the" should read --chamber.--.
Line 23, "likes." should be deleted, and "region of micromaching, the" should read --micromachined region,--.
Line 24, "the" (2nd occurrence) should be deleted.
Line 27, "directly contacted to the" should read --in direct contact with--.

UNITED STATES PATENT AND TRADEMARK OFFICE
CERTIFICATE OF CORRECTION

PATENT NO. : 7,069,631 B2
APPLICATION NO. : 11/240524
DATED : July 4, 2006
INVENTOR(S) : Akira Unno et al.

It is certified that error appears in the above-identified patent and that said Letters Patent is hereby corrected as shown below:

COLUMN 2 Cont.:
Line 29, "contacted to the" should read --in contract with--.
Line 41, "made" should read --made as--.
Line 44, "particularly" should be deleted, and "long" should read --a long head--.
Line 49, "plate;" should read --plate and--, "film; said" should read --film the--.
Line 55, "oxide layers sandwiching the aforementioned" should read --the vibrational plate being sandwiched between oxide layers, and the--.
Line 56, "layer; said" should be deleted, and "has" should read --having--.
Line 62, "substrate" should read --substrate, the silicon substrate--.
Line 66, "of" should read --of forming--.

COLUMN 3:
Line 7, "plate;" should read --plate and--, and "film; said" should read --film, the--.
Line 13, "oxide" should read --the vibrational plate being sandwiched between oxide--.
Line 14, "layers sandwiching the aforementioned layers, said" should read --layers, and the--, and "has" should read --having--.
Line 24, "substrate" should read --substrate, the silicon substrate--.
Line 26, "a" should read --and a--.
Line 35, "relative" should be deleted.
Line 41, "that" should read --that a--.
Line 47, "are uniform" should read --is uniform,--.
Line 50, "cation" should read --cation techniques--, and "is" should read --are--.
Line 52, "particularly" should be deleted.
Line 53, "a" should read --and a--.
Line 57, "FIG. 1" should read --FIG. 1(a)--.
Line 58, "invention (a), and" should read --invention, and FIG. 1(b) is--.
Line 59, "a" should read --the--.

COLUMN 4:
Line 13, "(b)" should read --FIG. 1(b)--.
Line 17, "FIG. 1," should read --FIGS. 1(a) and (b),--.
Line 23, "chamber 3 is" should read --chambers 3 are--.
Line 25, "outlet" should read --outlets--, and "chamber 3 as" should read --chambers 3--.
Line 28, "the" should read --bat--.
Line 31, "chamber" should read --chambers--.
Line 32, "structure 10 is" should read --structures 10 are--.
Line 33, "opening" should read --respective openings--.
Line 38, "comprises" should read --comprises a--.

UNITED STATES PATENT AND TRADEMARK OFFICE
CERTIFICATE OF CORRECTION

PATENT NO. : 7,069,631 B2
APPLICATION NO. : 11/240524
DATED : July 4, 2006
INVENTOR(S) : Akira Unno et al.

It is certified that error appears in the above-identified patent and that said Letters Patent is hereby corrected as shown below:

COLUMN 4 Cont.:
Line 39, "which" should read --and--.
Line 42, "single" should read --a single--.
Line 44, "Pt one" should read --Pt, or the--.
Line 50, "with" should read --which may--.
Line 51, "the result of" should read --result in--.
Line 52, "the" (1st occurrence) should read --its--, and "relative" should be deleted.
Line 66, "are" should read --are as follows. The film thickness--.

COLUMN 5:
Line 16, "element" should read --an element--.
Line 19, "formed on the upper" should be deleted.
Line 23, "the" (2nd occurrence) should be deleted.
Line 24, "with" should read --of--, and "has" should read --should have--.
Line 25, "orientation" should read --orientation of--.
Line 27, "said another" should read --the other--.
Line 29, "content is" should read --content of the metal element is preferably--.
Line 30, "preferably" should read --and further preferably--.
Line 36, "PSN-PT$\{(1-y)[Pb\{Sc_xNb_{1-x}\}O_3]$-y$[PbTiO_3]\}$," should read --PSN-PT$\{(1-y)[Pb\{Sc_xNb_{1-x}\}O_3]$-y$[PbTiO_3]\}$ or,--.
Line 42, "in" should read --and in--.
Line 48, "as" should read --at--.
Line 49, "30°C./min. Another method is" should read --30°C./min may be employed. Other methods are also--.
Line 56, "Zr" should read --a Zr--.

COLUMN 6:
Line 13, "programs" should read --problems--.
Line 18, "particularly" should be deleted.
Line 31, "is" should read --are--.
Line 32, "is" should read --are--.

COLUMN 7:
Line 26, "as" should read --as both--.
Line 40, "other" should read --further--.
Line 46, "the" (1st occurrence) should read --a--.
Line 47, "film" (2nd occurrence) should be deleted.
Line 61, "of" should read --of forming--.
Line 66, "opening;" should read --opening; and--.

UNITED STATES PATENT AND TRADEMARK OFFICE
CERTIFICATE OF CORRECTION

PATENT NO. : 7,069,631 B2
APPLICATION NO. : 11/240524
DATED : July 4, 2006
INVENTOR(S) : Akira Unno et al.

It is certified that error appears in the above-identified patent and that said Letters Patent is hereby corrected as shown below:

COLUMN 8:
Line 3, "of an upper" should be deleted.
Line 33, "small" should read --a small--, and "medal" should read --metal--.
Line 36, "another" should read --the other--.
Line 37, "of" should read --of the--.
Line 38, "from" should read --from the--.
Line 43, "the" should read --a--.
Line 52, "composition" should read --compositions--.
Line 60, "Ir," should read --Ir, or--.
Line 61, "SRO," should read --SRO or--.
Line 66, "that" should read --that a--.

COLUMN 9:
Line 3, "is" should read --are--.
Line 8, "in which" should read --performed upon--.
Line 12, "or" should read --or the--.
Line 15, "the" (1st occurrence) should read --a--.
Line 26, "etching," should read --etching, or a--.
Line 32, "etching" should read --an etching--.
Line 33, "resist" should read --a resist--.
Line 36, "side" should read --a side--.
Line 43, "resist" should read --a resist--.
Line 48, "the" should be deleted.
Line 49, "limiting," should read --limited,--.
Line 51, "finally." should read --last.--.
Line 59, "a" (3rd occurrence) should be deleted.
Line 60, "to a" should read --for--.
Line 67, "through" should read --by a--.

COLUMN 10:
Line 2, "24 film" should read --film 24--.
Line 3, "layer" should read --layer 21--.
Line 4, "through the" should read --by--, and "a" should read --an--.
Line 8, "electrode" should read --electrode 26 of--, and "26" should be deleted.
Line 13, "rising" should read --changing--.
Line 15, "step," should read --step, a--.
Line 17, "YSZ(100)" should read --YSZ(100) film--.
Line 18, "Si(100)21." should read --the Si(100) layer 21.--.
Line 20, "the" should be deleted.

UNITED STATES PATENT AND TRADEMARK OFFICE
CERTIFICATE OF CORRECTION

PATENT NO. : 7,069,631 B2
APPLICATION NO. : 11/240524
DATED : July 4, 2006
INVENTOR(S) : Akira Unno et al.

It is certified that error appears in the above-identified patent and that said Letters Patent is hereby corrected as shown below:

COLUMN 10 Cont.:
Line 21, "contents" should read --content--.
Line 24, "line" should read --ray--.
Line 25, "upper" should read --an upper--.
Line 27, "width" should read --width of--.
Line 28, "length" should read --length of--.
Line 32, "are" should read --were--.
Line 33, "driving" (both occurrences) should read --a driving--.
Line 37, "structures" should read --structure--.
Line 41, "durability" should read --durability- --.
Line 46, "the" should be deleted.
Line 51, "were" should read --was--.
Line 62, "34 layer" should read --layer 34--.
Line 63, "31" should read --layer 31--.
Line 66, "0.4μm" should read --a layer 0.4μ—--.

COLUMN 11:
Line 2, "has" should be deleted.
Line 3, "of" should be deleted, and "is" should read --was--.
Line 4, "MgO$_3$4" should read --MgO layer 34--, and "Si(100)31." should read --Si(100) layer 31.--.
Line 6, "C4F8" should read --$C_4F_8$--.
Line 11, "through" should read --by--.
Line 14, "second" should read --a second--, "36" should read --36 is a--, and "upper" should read --an upper--.
Line 21, "the" (2nd occurrence) should be deleted.
Line 26, "of" should read --in--.
Line 31, "of" should be deleted.
Line 33, "of" should be deleted, and "but" should read --but it--.
Line 35, "11μm," should read --the 11μm thick Si layer,--, and "of" should read --in--.
Line 36, "the" should be deleted.
Line 38, "10μm." should read --the 10μm thick Si layer.--.
Line 46, "or" should read --and--.
Line 51, "and" should be deleted.
Line 62, "quantities" should read --volumes--.

UNITED STATES PATENT AND TRADEMARK OFFICE
CERTIFICATE OF CORRECTION

PATENT NO. : 7,069,631 B2
APPLICATION NO. : 11/240524
DATED : July 4, 2006
INVENTOR(S) : Akira Unno et al.

It is certified that error appears in the above-identified patent and that said Letters Patent is hereby corrected as shown below:

COLUMN 12:
Line 40, "plate film" should read --plate and film--.

Signed and Sealed this

Seventeenth Day of June, 2008

JON W. DUDAS
*Director of the United States Patent and Trademark Office*